United States Patent
Su et al.

(10) Patent No.: US 9,232,632 B2
(45) Date of Patent: Jan. 5, 2016

(54) METHODS AND APPARATUSES FOR DETECTING REGISTRATION OFFSETS

(71) Applicants: PEKING UNIVERSITY FOUNDER GROUP CO., LTD., Beijing (CN); ZHUHAI FOUNDER TECH HI-DENSITY ELECTRONIC CO., LTD., Zhuhai, Guangdong (CN)

(72) Inventors: Xinhong Su, Zhuhai (CN); Chen Chen, Zhuhai (CN)

(73) Assignees: Peking University Founder Group Co., Ltd., Beijing (CN); Zhuhai Founder Tech Hi-Density Electronics Co., Ltd., Zhuhai, Guangdong (CN)

( * ) Notice: Subject to any disclaimer, the term of this patent is extended or adjusted under 35 U.S.C. 154(b) by 350 days.

(21) Appl. No.: 13/724,981

(22) Filed: Dec. 21, 2012

(65) Prior Publication Data

US 2013/0161072 A1 Jun. 27, 2013

(30) Foreign Application Priority Data

Dec. 21, 2011 (CN) .......................... 2011 1 0438926

(51) Int. Cl.
*H01B 12/00* (2006.01)
*H05K 1/02* (2006.01)
*H05K 3/06* (2006.01)
*H05K 3/46* (2006.01)

(52) U.S. Cl.
CPC .............. *H05K 1/0269* (2013.01); *H05K 3/067* (2013.01); *H05K 3/4679* (2013.01)

(58) Field of Classification Search
CPC . H05K 1/0269; H05K 1/0298; H05K 1/0265; H05K 1/0266; H05K 3/067; H05K 3/467
USPC ................ 216/13, 18, 19, 20, 84, 86, 95, 100
See application file for complete search history.

(56) References Cited

U.S. PATENT DOCUMENTS

| | | | |
|---|---|---|---|
| 6,316,731 B1 * | 11/2001 | Goshima | 174/250 |
| 2002/0131632 A1 * | 9/2002 | Vernackt | 382/151 |
| 2008/0066957 A1 * | 3/2008 | Hsu et al. | 174/650 |

* cited by examiner

*Primary Examiner* — Lan Vinh
(74) *Attorney, Agent, or Firm* — Finnegan, Henderson, Farabow, Garrett & Dunner, LLP (57) ABSTRACT

A method for detecting a registration offset is disclosed. The method includes transferring a first pattern to a metal layer on a first side of a printed circuit board (PCB) substrate. The first pattern has a reference scale. The method further includes transferring a second pattern to a metal layer on a second side opposite to the first side of the PCB substrate. The second pattern has a measurement scale. The second pattern is transferred by aligning an origin of the measurement scale with an origin of the reference scale in an apparatus such that at least a portion of the reference scale is overlapped with the measurement scale. The method includes etching the metal layers of the PCB substrate and measuring an offset in the patterns on the PCB substrate by using the reference scale and the measurement scale.

7 Claims, 8 Drawing Sheets

METHODS AND APPARATUSES FOR DETECTING REGISTRATION OFFSETS

CROSS REFERENCE OF RELATED APPLICATIONS

This application claims the benefit of Chinese Patent Application No. 201110438926.5, filed on Dec. 21, 2011, which is incorporated by reference in its entirety.

FIELD OF THE INVENTION

The invention relates to a technology for manufacturing Printed Circuit Boards (PCBs), in particular, to a method for detecting a registration offset and to a PCB substrate.

BACKGROUND OF THE INVENTION

With development of the PCB technology, a multi-layer circuit board has an increased density between layers. Since a signal is needed to be transmitted between various layers of the multi-layer circuit board, the various layers of the multi-layer circuit board have to be electrically conductive with each other. Therefore, adjacent layers of the multi-layer circuit board need to have strictly corresponding locations for electrically conducting with each other. Deviations therebetween would affect the transmission of signals between adjacent layers.

Each layer of the multi-layer circuit board has a shape formed by printing a pattern on a copper foil layer of the circuit board by way of pattern transfer. During the pattern transfer, an exposure apparatus is used for forming a pattern on a photo-resist film on a copper foil layer by exposure.

Due to alignment errors in the exposure apparatus, during the exposure, patterns on adjacent copper foil layers which should be aligned with one another may have a registration offset from each other. After an etching process, due to the registration offset between the patterns at the conductive locations of adjacent layers, the conduction between the copper coils of the adjacent layers and thus the transmission of signal may be affected.

It is noted by the inventors of the present application that registration precision of the exposure apparatus is currently mainly determined according to an offset between positioning bores on adjacent layers after exposure. By this method, however, the registration offset of the exposure apparatus cannot be detected accurately.

SUMMARY OF EMBODIMENTS

A method is provided for detecting a registration offset as well as manufacturing a PCB substrate, so as to solve the above-mentioned problem that the registration offset of the exposure apparatus cannot be detected accurately.

In one embodiment, a method for detecting a registration offset is provided. The method includes transferring a first pattern to a metal layer on a first side of a printed circuit board (PCB) substrate. The first pattern has a reference scale. The method further includes transferring a second pattern to a metal layer on a second side opposite to the first side of the PCB substrate. The second pattern has a measurement scale. The second pattern is transferred by aligning an origin of the measurement scale with an origin of the reference scale in an apparatus such that at least a portion of the reference scale is overlapped with the measurement scale. The method includes etching the metal layers of the PCB substrate and measuring an offset in the patterns on the PCB substrate by using the reference scale and the measurement scale.

In another embodiment, a PCB substrate is provided. The substrate includes a first pattern having a reference scale, formed on a metal layer at a first side of the PCB substrate. The substrate further includes a second pattern having a measurement scale, formed on a metal layer at a second side opposite to the first side of the PCB substrate. The reference scale and the measurement scale are overlapped with each other. A length of N graduations in the reference scale is equal to a length of N−1 graduations in the measurement scale. N is a natural number greater than 1.

In some embodiments, the reference scale and the measurement scale on the metal layers on two sides of the PCB substrate can be used to measure a displacement therebetween. This displacement may also be considered as the displacement between the first and second patterns formed in the process of transferring pattern. Since the process of transferring pattern is performed by an exposure apparatus, the displacement is also the registration offset of the exposure apparatus. Therefore the registration offset can be detected more accurately.

BRIEF DESCRIPTION OF THE DRAWINGS

Attached drawings illustrated herein are used to provide further understanding of the invention, which constitute a part of the application. Exemplary embodiments and descriptions thereof are used to explain the invention but not intended to limit the invention.

DESCRIPTION OF THE PREFERRED EMBODIMENTS

Hereinafter, the invention will be described in detail with reference to the accompanying drawings.

Figure 1:
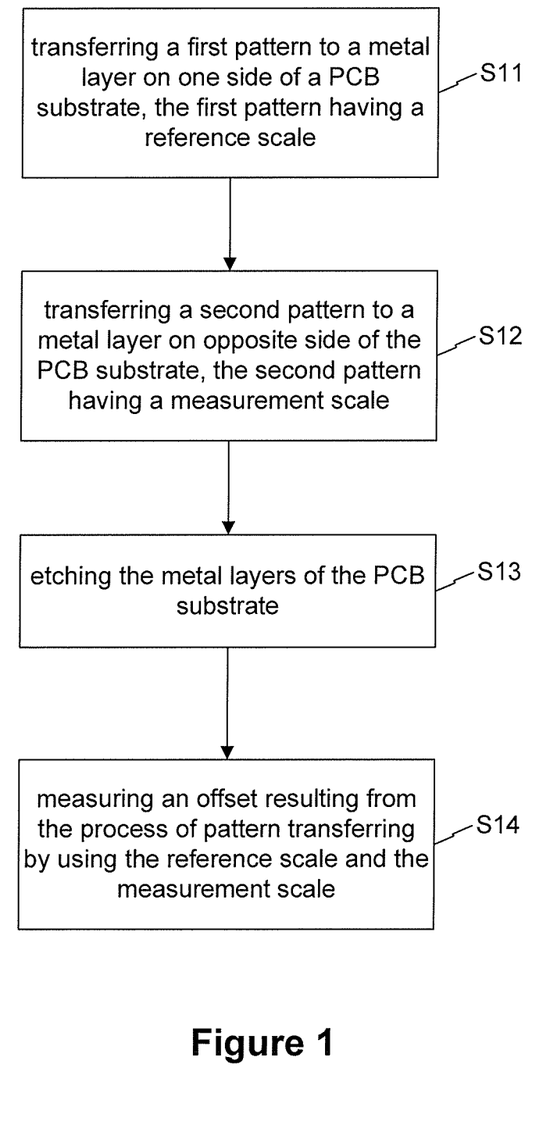
FIG. 1 shows a flow chart according to a first embodiment.

FIG. 1 illustrates an exemplary method of measuring an offset of layers arranged on opposite sides of a PCB substrate.

At step S11, a first pattern may be transferred onto a metal layer on one side of a PCB substrate, wherein the first pattern has a reference scale.

At step S12, a second pattern may be transferred on to a metal layer at an opposite side of the PCB substrate, wherein the second patter has a measurement scale.

In the transferring processes, the second pattern may be transferred by aligning the origin of the measurement scale with that of the reference scale, such that the measurement scale is overlapped with the reference scale. In one embodiment, the length of N graduations in the reference scale is equal to the length of N−1 graduations in the measurement scale, wherein N is a natural number greater than 1.

At step S13, the metal layers of the PCB substrate may be etched.

At step S14, an offset in the process of transferring the patterns may be measured by using the reference scale and the measurement scale.

In the above transferring process, the measurement scale and the reference scale may be transferred in any order. For example, the measurement scale may be transferred before the reference scale is transferred onto a PCB substrate. The order of transferring the scales has no effect on the subsequent measuring process. Since the originals of the measurement scale and the reference scale are set to be aligned in an exposure equipment, if there is any deviation generated during the transferring, an offset in the patterns transferred can be measured based on the displacement of the origins of the measurement scale and the origin of the reference scale after the etching process.

Figure 2:
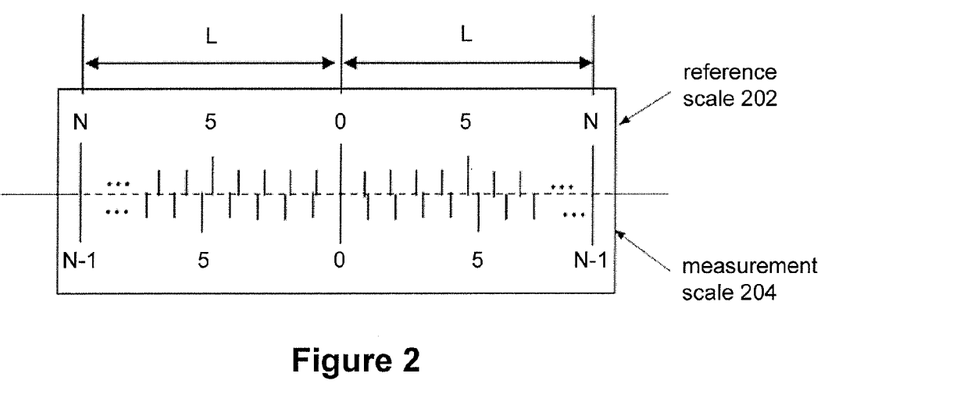
FIG. 2 is a schematic view showing a reference scale and a measurement scale in one embodiment.

Referring to FIG. 2, a length L of N graduations in reference scale 202 equals to a length L of N−1 graduations in measurement scale 204. Here, the origins (zero points) of the reference and measurement scales are set to lie in the middle of each scale. One of ordinary skill in the art may understand that the originals may also be set at the left or right end of the scales.

Figure 3:
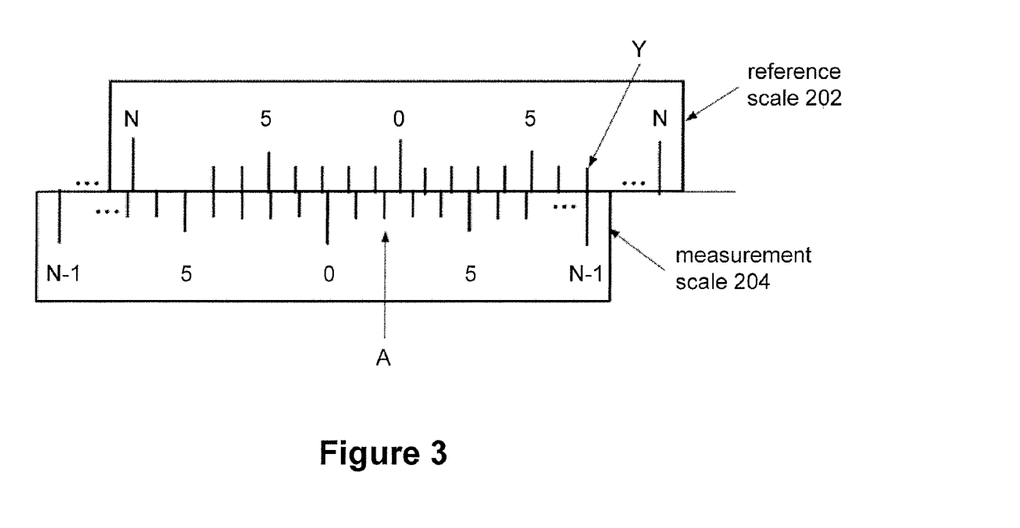
FIG. 3 is a schematic view for measuring an offset using a displacement between a reference scale and a measurement scales on a double-sided substrate.

Referring to FIG. 3, during the measurement step, a first offset A is obtained when the origin of reference scale 202 goes beyond the origin of measurement scale 204 by A graduations in measurement scale 204. Further, it can be determined that the Y-th graduation in reference scale 202 is aligned with a graduation in measurement scale 204 behind the A-th graduation in the measurement scale 204. In this case, an offset is determined as A*(Y/N) units, wherein one unit equals to L/(N−1), L being the length of N−1 graduations in the measurement scale 204.

With the above embodiment, the reference scale and the measurement scale on both metal layers of the etched PCB substrate can be used to measure a displacement therebetween. This displacement is also considered as a displacement between the first and second patterns in the process of transferring patterns. Since the process of transferring patterns is generally performed by an exposure apparatus, this displacement is also the registration offset of the exposure apparatus. Therefore, the registration offset of an exposure can be determined accurately.

Figure 4:
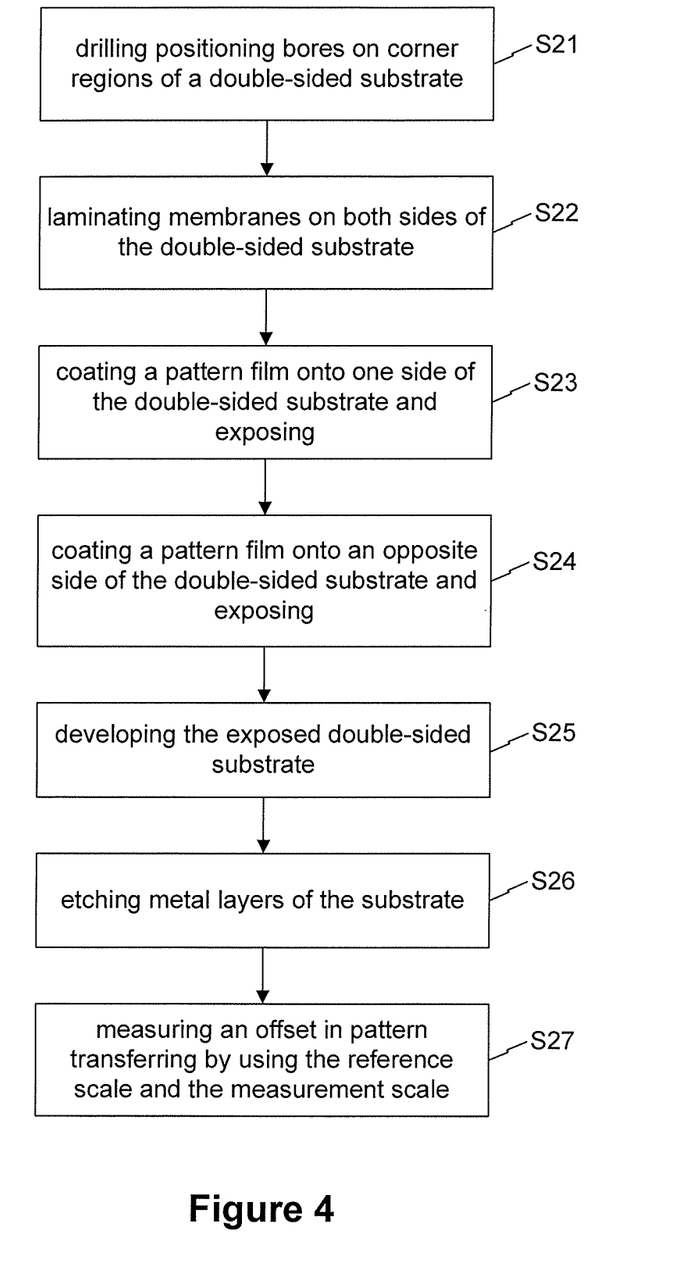
FIG. 4 shows a flow chart according to one embodiment.

Referring to FIG. 4, another embodiment is illustrated.

Figure 5:
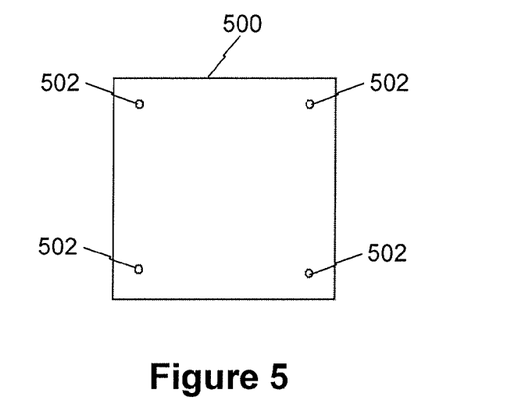
FIG. 5 is a schematic view showing a substrate with drilled positioning bores.

At step S21, positioning bores 502 may be drilled on corner regions of a double-sided substrate 500. An example of a double-sided substrate 500 with positioning bores 502 is shown in FIG. 5.

Figure 6:
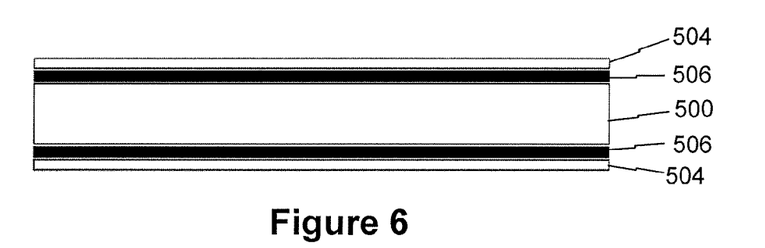
FIG. 6 is a schematic view showing a substrate with laminated membranes.

At step S22 (FIG. 4), membranes 504, 506 may be laminated on both sides of the double-sided substrate 500, respectively. Membranes 504 may be arranged at outer sides of membranes 506 which are metal films. Membranes 504 may be photo-sensitive materials. A double-sided substrate laminated with the membranes is shown in FIG. 6.

Figure 7:
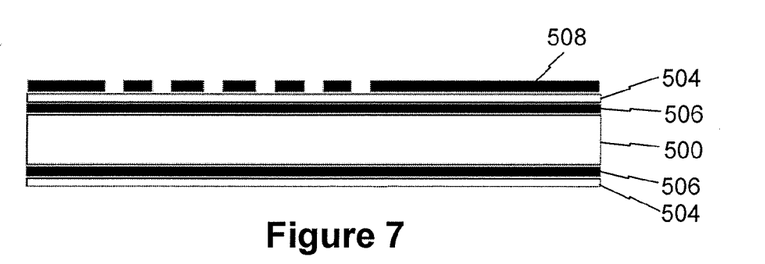
FIG. 7 is a schematic view showing a substrate adhered with a pattern film at one surface.

At Step S23 (FIG. 4), a pattern film 508 may be coated onto a first surface of the double-sided substrate 500. An example is shown in FIG. 7.

Figure 8:
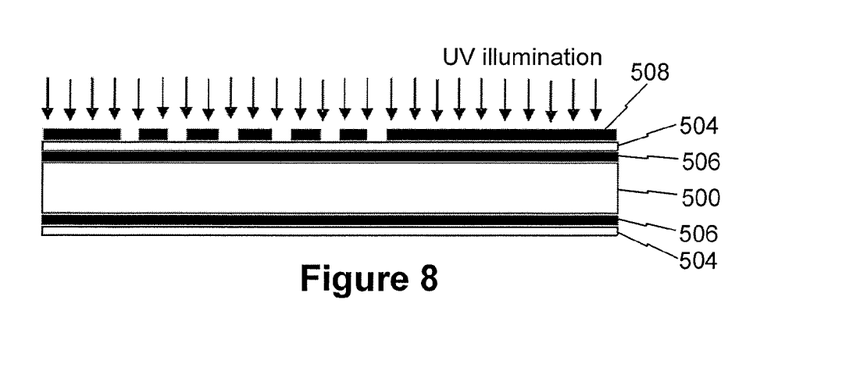
FIG. 8 is a schematic view of exposing a substrate.

A process for coating a pattern film 508 onto an upper surface of the double-sided substrate 500 may be called "upstream pattern film coating". Referring to FIG. 8, a first pattern having a reference scale may be transferred onto membrane 504 by an photo-exposure through pattern film 508. For example, a UV light source may be utilized in the exposure process.

Figure 9:
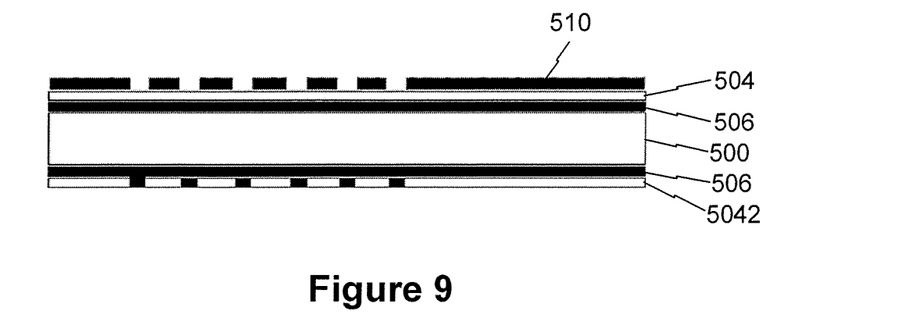
FIG. 9 is a schematic view showing a substrate adhered with a pattern film at an opposition side.

At step S24 (FIG. 4), a second pattern film 510 may be coated onto a second surface located at an opposite side from the first surface of the substrate 500. An example is shown in FIG. 9. Note that substrate 500 has been flipped so that the second surface of the substrate now facing upwards. The previously exposed membrane 5042 are located at the bottom in FIG. 9. However, it may not be necessary to flip a substrate for coating pattern films on the opposite surfaces of the substrate.

Figure 10:
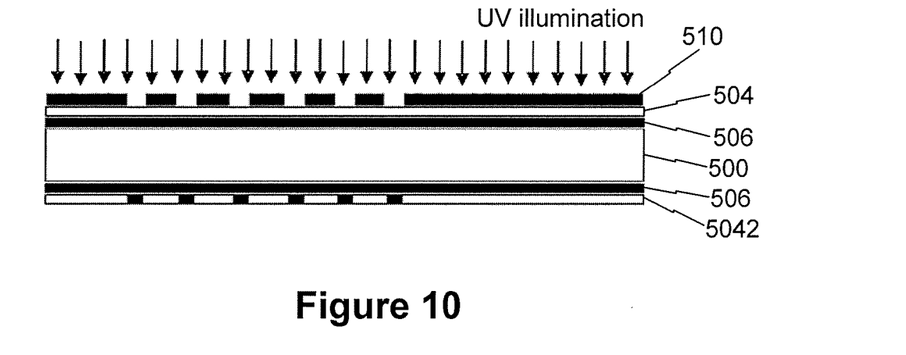
FIG. 10 is a schematic view of exposing the substrate from the opposite side.

A process for coating a pattern film at the opposite side of the substrate may be called "downstream pattern film coating". Referring to FIG. 10, a second pattern having a measurement scale is transferred onto membrane 504 by an photo-exposure through pattern film 510. For example, a UV light source may be utilized in the exposure process.

Referring to FIG. 2, during the process of coating the second pattern film at the opposite side of the substrate, the origin of the measurement scale on the second pattern film may be aligned with the origin of the reference scale on the first pattern on the opposite side, such that the measurement scale is overlapped with the reference scale. The length of N graduations in the reference scale is designed to equal to the length of N−1 graduations in the measurement scale, N being a natural number greater than 1.

At step S25 (FIG. 4), the exposed double-sided substrate may be developed.

Figure 11:
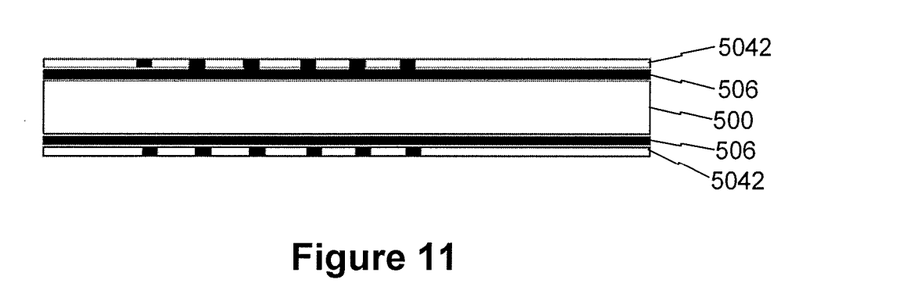
FIG. 11 is a schematic view showing the double-sided substrate after exposures.
Figure 12:
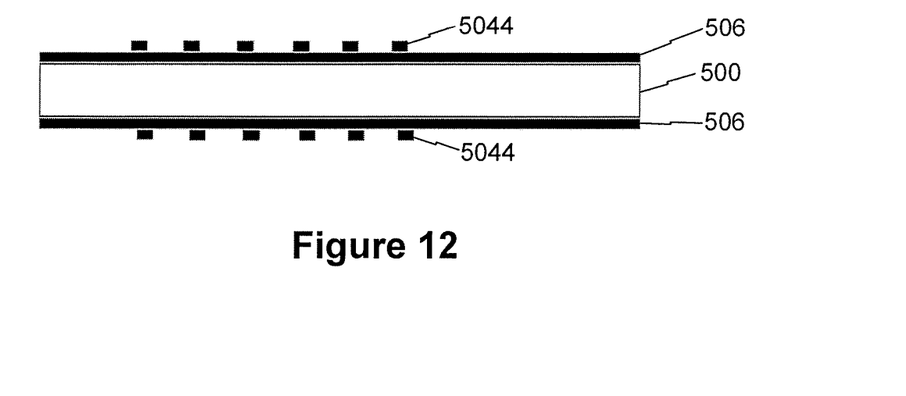
FIG. 12 is a schematic view showing the double-sided substrate after development.

FIG. 11 shows the exemplary double-sided substrate 500 after exposure, and FIG. 12 shows the double-sided substrate after developing. In FIG. 12, unexposed portions of membranes 5042 (FIG. 11) are removed, while exposed portions 5044 remain on metal membranes 506 after developing.

At step S26 (FIG. 4), both metal membranes 506 of the PCB substrate may be etched.

Figure 13:
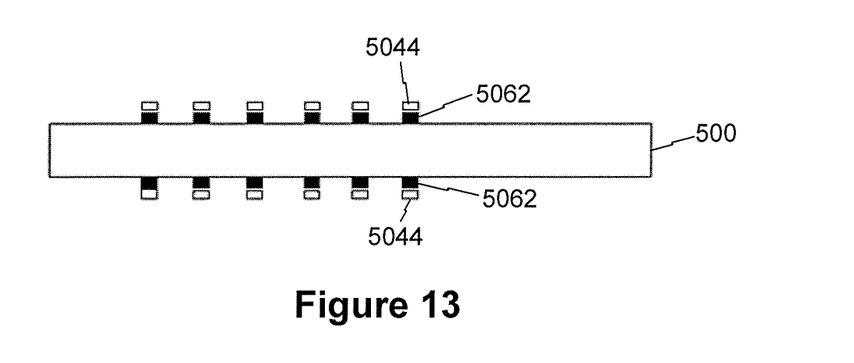
FIG. 13 is a schematic view showing the double-sided substrate after etching.
Figure 14:
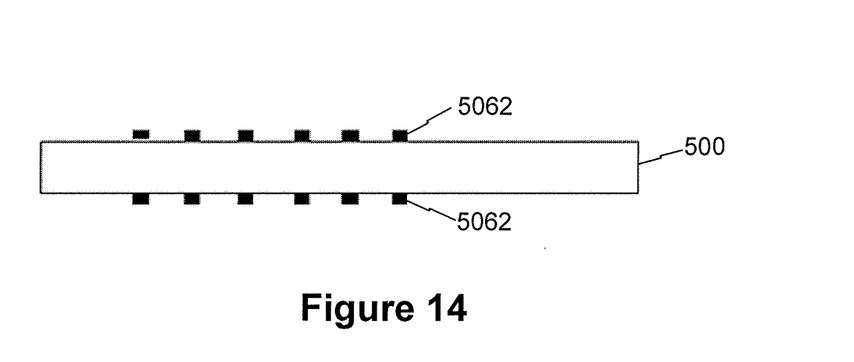
FIG. 14 is a schematic view showing the double-sided substrate with the membranes removed.

FIG. 13 shows the double-sided substrate 500 after etching. The remaining metal patterns are denoted 5062. With reference to FIG. 14, membranes 5044 has been removed from the double-sided substrate 500.

At step S27 (FIG. 4), an offset in the transferred patterns 5062 is measured by using the reference scale and the measurement scale.

Figure 15:
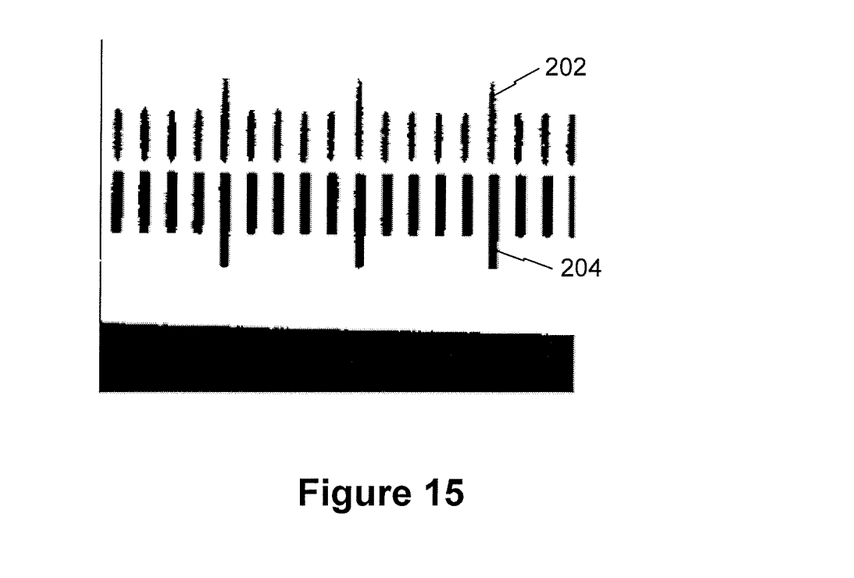
FIG. 15 is a schematic view showing a position of a measurement scale and a reference scale on a double-sided substrate.

FIG. 15 shows the double-sided substrate with the measurement scale 204 on one side and the reference scale 202 on the opposite side. The displacement between the patterns on both sides of the substrate can be measured by measuring the displacement between the measurement scale and the reference scale.

The reference scale and the measurement scale may be formed on each corner region of a PCB substrate. On each corner region, one or more sets of the reference scale and the measurement scale may be formed.

Figure 16:
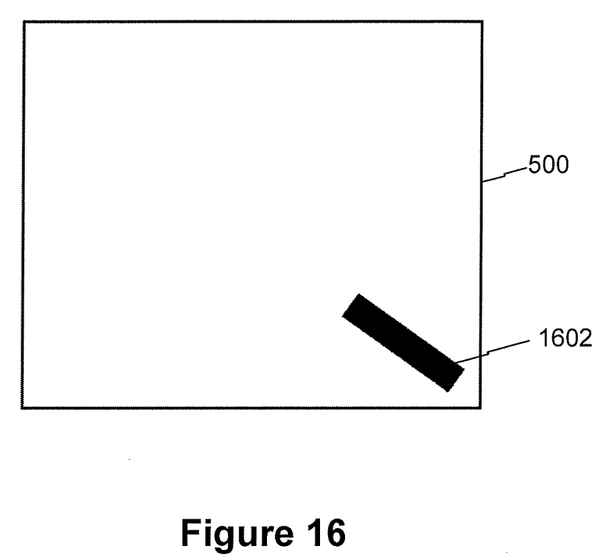
FIG. 16 is a schematic view showing a reference scale and a measurement scale formed on a double-sided substrate.

In one embodiment, the scales for measuring exposure offsets may be arranged to locate at one or more corner regions of a PCB substrate. Referring to FIG. 16, in one embodiment, measuring scales 1602 including at least one reference scale (not shown) and one measurement scale (not shown) are arranged at the lower-right corner of substrate 500. A long axis of scales 1602 lie in a diagonal direction of the substrate. That is, scales 1602 extend towards the center of substrate 500.

Figure 17:
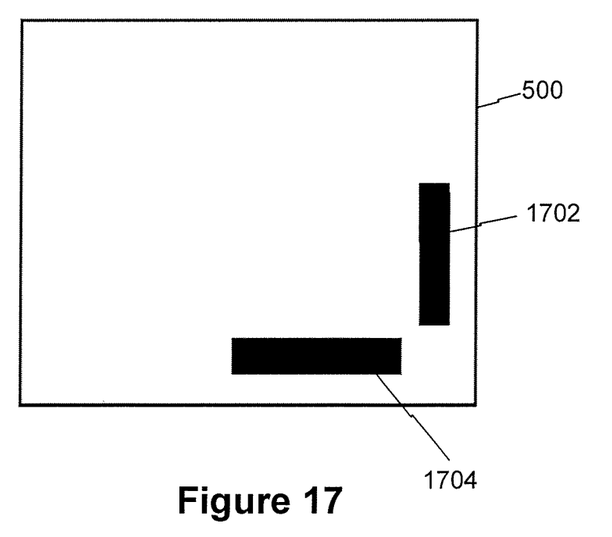
FIG. 17 is a schematic view showing reference scales and measurement scales formed on a double-sided substrate.

In another embodiment, each corner of the substrate may include two sets of measuring scales. Each set of measuring scales includes at least one reference scale and one measurement scale. Referring to FIG. 17, in one embodiment, two sets of measuring scales 1702 and 1704 are arranged at lower-right corner of substrate 500, of which scale set 1702 extends parallel to a vertical edge of the substrate and scale set 1704 extends parallel to a horizontal edge of the substrate.

To facilitate a showing of the displacement direction of the first or second pattern, the origins of the reference scale and the measurement scale may be located in the middle of respective scales. In this way, the offset can be measured regardless of which pattern has a relative displacement.

Referring back to FIG. 3, during the measurement (S27), a first offset A may be obtained when the origin of the reference scale 202 goes beyond the origin of the measurement scale 204 by A graduations in the measurement scale 204. Further, it can be determined that the Y-th graduation in the reference scale 202 is aligned with a graduation in the measurement scale 204 behind the A-th graduation in the measurement scale 204. In this case, an offset is determined as $A*(Y/N)$ units, wherein one unit equals to $L/(N-1)$, L being the length of $N-1$ graduations in the measurement scale 204. $1/N$ is the measurement precision, wherein N may be 10, 20, 50 and the like.

Since the length L of N graduations in the reference scale equals to the length L of $N-1$ graduations in the measurement scale, a unit graduation length in the measurement scale is $L/(N-1)$, and a unit graduation length in the reference scale is $L/N$. Thus, each unit graduation length in the measurement scale is larger than the unit graduation length in the reference scale by $L/N(N-1)$.

Figure 18:
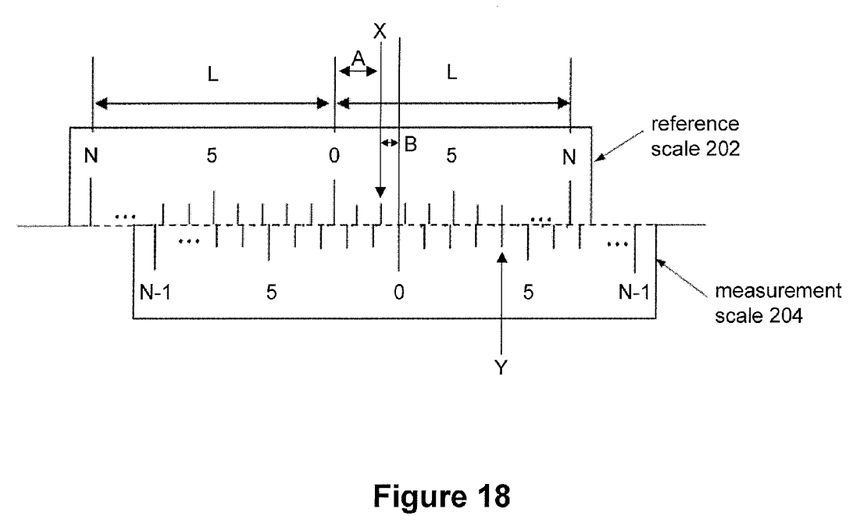
FIG. 18 is a schematic view for measuring an offset using a displacement between a reference scale and a measurement scales on a double-sided substrate.

The measurement illustrated in FIG. 3 is performed by counting how many graduations of the reference scale go beyond the original of the measurement scale. Alternatively, it may also be performed by counting how many graduations of the measurement scale go beyond the original of the reference scale. An example is shown in FIG. 18. First, it can be determined that the original of measurement scale 204 goes beyond the X-th graduation of reference scale 202 but do not exceed the (X+1)-th graduation. Thus, an offset A can be determined according to $A=X*L/N$.

Next step is to find a graduation in the measurement scale which is best aligned with a graduation in the reference scale. As shown in FIG. 18, if the best aligned graduation is the Y-th graduation in the measurement scale, an offset B can be determined according to $B=Y*L/N(N-1)$.

Finally, the total registration offset R can be obtained according to $R=A+B=X*L/N+Y*L/N(N-1)$. When L equals to N, the precision is $1/(N-1)$. This offset is the offset between the first and second patterns.

According to the embodiments, since it may be necessary to find out a graduation in the measurement scale best aligned with a graduation in the reference scale, it is preferable that the number of graduations in the measurement scale or the reference scale is as large as possible, such as 2N or 3N and the like. This can prevent a finding of no graduation in the measurement scale aligned with a graduation in the reference scale.

With the method in the above embodiments, a PCB substrate may be obtained, in which a first pattern having a reference scale may be formed of a metal layer on one side of the PCB substrate, and a second pattern having a measurement scale may be formed of a metal layer on an opposite side of the PCB substrate.

The reference scale and the measurement scale may be arranged to overlap with each other. The length of N graduations in the reference scale is equal to the length of $N-1$ graduations in the measurement scale, wherein N is a natural number greater than 1.

In the process of transferring the first and second patterns, the origin of the reference scale is set to be aligned with the origin of the measurement scale in an exposure apparatus. But due to errors of the exposure apparatus, an offset inevitably occurs.

In some embodiments, the reference scale and the measurement scale are formed on one or more corner regions of the PCB substrate. On each corner region, one or more sets of the reference scale and the measurement scale may be provided.

In some embodiments, the reference scale and the measurement scale may extend along a diagonal direction and towards a center of the PCB substrate.

In some embodiments, two sets of the reference scale and the measurement scale are formed on each corner region, and extend in parallel to two edges of the corner regions, respectively.

In some embodiments, the origins of the reference scale and the measurement scale may be located in the middle of respective scales.

In various embodiments, it is possible that the first pattern have the reference scale and the second pattern have the measurement scale. Other patterns to be processed may also be included in forming the scales. During the process of manufacturing the PCB substrate, a displacement between the patterns can be measured accurately through the disclosed scales, such that the precision of the exposure apparatus can be adjusted. The registration precision of the exposure apparatus can also be verified.

It should be understood by those skilled in the art that the above modules or steps of the embodiments can be achieved using general computing apparatus, which may be integrated in single computing apparatus or distributed on a network consisting of a plurality of computing apparatus. Alternatively, they may be implemented by programs codes executable by a computing apparatus, which may be stored in non-transitory storage apparatus for executing by the computing apparatus. Alternatively, the modules or steps may be implemented by integrated circuit modules, or some of them may be implemented by a single integrated circuit module. As such, the embodiments are not limited to the any specific combination of hardware and software.

Only exemplary embodiments have been described above. The descriptions are not intended to limit the invention. For those skilled in the art, the invention may have various modifications and changes based on this disclosure. The modifications, equivalent substitutions, improvements and the like should fall in the scope of protection of the invention without departing from the spirit and principle of the invention.

What is claimed is:

1. A method for detecting a registration offset, comprising:
    transferring a first pattern to a metal layer on a first side of a printed circuit board (PCB) substrate, the first pattern having a reference scale;
    transferring a second pattern to a metal layer on a second side opposite to the first side of the PCB substrate, the second pattern having a measurement scale, wherein the second pattern is transferred by aligning an origin of the measurement scale with an origin of the reference scale in an apparatus such that at least a portion of the reference scale is overlapped with the measurement scale;
    etching the metal layers of the PCB substrate; and
    measuring an offset in the patterns on the PCB substrate by using the reference scale and the measurement scale,
    wherein the origins are located in the middle of the reference scale and the measurement scale, respectively.

2. The method according to claim 1, wherein
    a length of N graduations in the reference scale is equal to that of N−1 graduations in the measurement scale, N being a natural number larger than 1;
    measuring the offset comprises:
        determining that the origin of the reference scale goes beyond the origin of the measurement scale by A graduations in the measurement scale;
        determining that a Y-th graduation in the reference scale is aligned with a graduation in the measurement scale behind an A-th graduation in the measurement scale; and
        determining the offset as being A*(Y/N) units, wherein 1 unit=L/(N−1), L being a length of N−1 graduations in the measurement scale.

3. The method according to claim 1, wherein the reference scale and the measurement scale extend from a corner of the PCB substrate towards a center of the PCB substrate.

4. The method according to claim 1, wherein the reference scale and the measurement scale are formed on a corner region of the PCB substrate.

5. The method according to claim 4, wherein the reference scale and the measurement scale are a pair of scales, and
    the method further comprises forming one or more pairs of scales on one or more corner regions of the PCB substrate.

6. The method according to claim 5, wherein two pairs of the reference scales and the measurement scales are formed on each of the corner regions, and extend along two edges of said each of the corner regions, respectively.

7. The method according to claim 4, wherein the reference scale and the measurement scale extend from a corner of the PCB substrate towards a center of the PCB substrate.

* * * * *